United States Patent
Neudorf et al.

(10) Patent No.: US 11,824,433 B2
(45) Date of Patent: Nov. 21, 2023

(54) INRUSH CURRENT LIMITED AC/DC POWER CONVERTER APPARATUS

(71) Applicant: Mate. LLC, Oklahoma City, OK (US)

(72) Inventors: Jason Neudorf, Calgary (CA); Steven Lyons, Calgary (CA); Kyle Hathaway, Calgary (CA)

(*) Notice: Subject to any disclaimer, the term of this patent is extended or adjusted under 35 U.S.C. 154(b) by 232 days.

(21) Appl. No.: 17/236,523

(22) Filed: Apr. 21, 2021

(65) Prior Publication Data

US 2021/0296981 A1   Sep. 23, 2021

Related U.S. Application Data

(63) Continuation of application No. PCT/CA2019/051503, filed on Oct. 23, 2019.

(60) Provisional application No. 62/751,086, filed on Oct. 26, 2018.

(51) Int. Cl.
| | | |
|---|---|---|
| *H02M 1/00* | (2006.01) | |
| *H02H 9/02* | (2006.01) | |
| *H02M 1/36* | (2007.01) | |
| *H02M 1/42* | (2007.01) | |
| *H02M 1/32* | (2007.01) | |
| *H02M 3/158* | (2006.01) | |
| *G01R 19/165* | (2006.01) | |
| *G01R 19/175* | (2006.01) | |

(52) U.S. Cl.
CPC ...... *H02M 1/007* (2021.05); *G01R 19/16538* (2013.01); *G01R 19/175* (2013.01); *H02H 9/02* (2013.01); *H02M 1/32* (2013.01); *H02M 1/36* (2013.01); *H02M 1/4225* (2013.01); *H02M 3/158* (2013.01)

(58) Field of Classification Search
CPC ........ H02M 1/32; H02M 1/36; H02M 3/1582; H02M 1/0009
See application file for complete search history.

(56) References Cited

U.S. PATENT DOCUMENTS

| | | | |
|---|---|---|---|
| 5,640,061 | A | 6/1997 | Bornhorst et al. |
| 5,821,703 | A | 10/1998 | Callahan et al. |
| 6,469,457 | B2 | 10/2002 | Callahan |
| | | (Continued) | |

FOREIGN PATENT DOCUMENTS

| | | |
|---|---|---|
| CA | 2913239 A1 | 12/2014 |
| CN | 201001217 | 1/2008 |
| | (Continued) | |

OTHER PUBLICATIONS

Canadian Intellectual Property Office, International Search Report for PCT Application PCT/CA2019/051503, dated Apr. 30, 2020.

(Continued)

*Primary Examiner* — Gustavo A Rosario-Benitez
(74) *Attorney, Agent, or Firm* — Young's Patent Services, LLC; Bruce A. Young

(57) ABSTRACT

A method and system for controlling and/or limiting inrush current is described. The system includes a buck converter section; a power factor conversion (PFC) boost converter section; and a storage capacitor section. In a first mode of operation, the boost converter section is disabled and the buck converter section is active and in a second mode of operation, the boost converter section is active and the buck converter section is disabled.

27 Claims, 6 Drawing Sheets

(56) References Cited

U.S. PATENT DOCUMENTS

| | | | |
|---|---|---|---|
| 6,487,098 B2 | 11/2002 | Malik et al. | |
| 6,731,524 B2 | 5/2004 | Elek et al. | |
| 6,862,201 B2 | 3/2005 | Hodge, Jr. | |
| 7,067,992 B2 | 6/2006 | Leong et al. | |
| 7,178,941 B2 | 2/2007 | Roberge et al. | |
| 7,321,203 B2 | 1/2008 | Marosek | |
| 7,344,279 B2 | 3/2008 | Mueller et al. | |
| 7,490,957 B2 | 2/2009 | Leong et al. | |
| 7,511,437 B2 | 3/2009 | Lys et al. | |
| 7,598,686 B2 | 10/2009 | Lys et al. | |
| 7,902,769 B2 | 3/2011 | Shteynberg et al. | |
| 8,033,677 B1 | 10/2011 | Olsson et al. | |
| 8,143,810 B2 | 3/2012 | Ferro | |
| 8,299,987 B2 | 10/2012 | Neudorf et al. | |
| 8,400,061 B2 | 3/2013 | Kuang et al. | |
| 8,525,446 B2 | 9/2013 | Tikkanen et al. | |
| 8,742,674 B2 | 6/2014 | Shteynberg et al. | |
| 8,853,958 B2 | 10/2014 | Athalye et al. | |
| 8,926,133 B2 | 1/2015 | Booth | |
| 8,957,601 B2 | 2/2015 | Tikkanen et al. | |
| 9,039,230 B2 | 5/2015 | Crimi et al. | |
| 9,041,379 B2 | 5/2015 | Lyons | |
| 9,049,759 B2 | 6/2015 | Tikkanen et al. | |
| 9,078,310 B2 | 7/2015 | Tikkanen et al. | |
| 9,173,273 B2 | 10/2015 | Zudrell-Koch et al. | |
| 9,320,093 B2 | 4/2016 | Tikkanen et al. | |
| 9,433,053 B2 | 8/2016 | Neudorf | |
| 9,485,833 B2 | 11/2016 | Datta et al. | |
| 9,591,713 B2 | 3/2017 | Tikkanen et al. | |
| 9,775,207 B2 | 9/2017 | Tikkanen et al. | |
| 9,812,967 B2 | 11/2017 | Sonnaillon | |
| 9,942,954 B2 | 4/2018 | Neudorf et al. | |
| 10,045,421 B2 | 8/2018 | Tikkanen et al. | |
| 10,076,016 B2 | 9/2018 | Tikkanen et al. | |
| 10,187,946 B2 | 1/2019 | Tikkanen et al. | |
| 2003/0209997 A1 | 11/2003 | St-Germain et al. | |
| 2005/0128751 A1 | 6/2005 | Roberge et al. | |
| 2005/0162101 A1 | 7/2005 | Leong et al. | |
| 2005/0213353 A1 | 9/2005 | Lys | |
| 2005/0269997 A1 | 12/2005 | Usui et al. | |
| 2006/0022214 A1 | 2/2006 | Morgan et al. | |
| 2006/0076908 A1 | 4/2006 | Morgan et al. | |
| 2006/0109204 A1 | 5/2006 | Chen | |
| 2006/0274468 A1 | 12/2006 | Phadke | |
| 2007/0146951 A1* | 6/2007 | Takahashi | H02H 3/087 361/93.1 |
| 2007/0267984 A1 | 11/2007 | Peng | |
| 2007/0273299 A1 | 11/2007 | Miskin et al. | |
| 2008/0079796 A1 | 4/2008 | Makuta et al. | |
| 2008/0191642 A1 | 8/2008 | Slot et al. | |
| 2008/0197786 A1 | 8/2008 | Schaible et al. | |
| 2008/0203945 A1 | 8/2008 | Deurenberg et al. | |
| 2008/0224629 A1 | 9/2008 | Melanson | |
| 2009/0206660 A1* | 8/2009 | Makita | H02J 7/1423 307/9.1 |
| 2009/0237007 A1 | 9/2009 | Leng | |
| 2009/0251068 A1 | 10/2009 | Holec et al. | |
| 2010/0060194 A1 | 3/2010 | Furry et al. | |
| 2011/0204820 A1 | 8/2011 | Tikkanen et al. | |
| 2011/0234109 A1 | 9/2011 | Chiu | |
| 2012/0007512 A1 | 1/2012 | Kim et al. | |
| 2012/0049745 A1 | 3/2012 | Li et al. | |
| 2012/0086356 A1 | 4/2012 | Chan et al. | |
| 2012/0262144 A1* | 10/2012 | Lyons | H05B 45/3725 323/311 |
| 2012/0280632 A1 | 11/2012 | Kim et al. | |
| 2012/0286696 A1 | 11/2012 | Ghanem | |
| 2012/0323394 A1 | 12/2012 | Gandhi | |
| 2013/0016531 A1 | 1/2013 | Aso | |
| 2013/0057247 A1 | 3/2013 | Russell et al. | |
| 2013/0063047 A1 | 3/2013 | Veskovic | |
| 2013/0241527 A1 | 9/2013 | Russell et al. | |
| 2014/0009134 A1* | 1/2014 | Bernardon | H02M 3/156 323/284 |
| 2014/0103804 A1 | 4/2014 | Zhdanau et al. | |
| 2014/0184076 A1 | 7/2014 | Murphy | |
| 2014/0265931 A1 | 9/2014 | Greenwood | |
| 2015/0008837 A1 | 1/2015 | Teufel | |
| 2015/0028778 A1 | 1/2015 | Zudrell-Koch | |
| 2015/0097484 A1 | 4/2015 | Lee et al. | |
| 2015/0162815 A1* | 6/2015 | Mikami | H02M 3/1582 323/311 |
| 2015/0257223 A1 | 9/2015 | Siessegger et al. | |
| 2015/0295494 A1* | 10/2015 | Gong | H05B 45/375 315/224 |
| 2015/0327340 A1 | 11/2015 | Siessegger et al. | |
| 2016/0128144 A1 | 5/2016 | Tikkanen et al. | |
| 2016/0227616 A1 | 8/2016 | Lee | |
| 2016/0344292 A1* | 11/2016 | Sonnaillon | H02M 1/32 |
| 2017/0110873 A1 | 4/2017 | Glovinski et al. | |
| 2017/0127497 A1 | 5/2017 | Baek et al. | |
| 2017/0141565 A1* | 5/2017 | White | H02H 9/02 |
| 2017/0299215 A1* | 10/2017 | Li | F24F 11/58 |
| 2017/0332462 A1 | 11/2017 | Tikkanen | |
| 2018/0116022 A1 | 4/2018 | Lőrincz et al. | |
| 2020/0068680 A1 | 2/2020 | Neudorf et al. | |

FOREIGN PATENT DOCUMENTS

| | | |
|---|---|---|
| CN | 101325366 A | 12/2008 |
| CN | 102201958 B | 12/2013 |
| JP | 2006344919 A | 12/2006 |
| KR | 20110092100 A | 8/2011 |
| WO | 2003067934 A2 | 8/2003 |
| WO | 2010031169 A1 | 3/2010 |
| WO | 2017181063 A1 | 10/2017 |
| WO | 2020082178 A1 | 4/2020 |

OTHER PUBLICATIONS

Canadian Intellectual Property Office, Written Opinion of the International Search Authority for PCT Application PCT/CA2019/051503, dated Apr. 30, 2020.

Korotkov S et al.: "Integrated AC/DC converter with high power factor", INAPEC'98 Thirteenth Annual Applied Power Electronics Conference and Exposition, vol. 1, Feb. 15, 1998 (Feb. 15, 1998), pp. 434-440.

Morrison R et al.: "A new modulation strategy for a buck-boost input AC/DC converter", IEEE Transactions on Power Electronics, vol. 16, No. 1, Jan. 2001 (Jan. 1, 2001), pp. 34-45.

Chang, Novel AC Driver and Protection Circuits With Dimming Control for LEDs, 2007.

Inns, Controlling LED Brightness Using PWM, Apr. 15, 2010.

Lighting Reseach Center, Lighting Research Program Project 3.2 Energy Efficient Load Shedding Lighting Technology, Feb. 2008.

Maxim Integrated, Driving LEDs with Constant Current Port Expander Outputs, Sep. 12, 2003.

Nuttall, Design of a LED Street Lighting System, Apr. 2-4, 2008.

O'Shea, LED Dimming Solutions, Jan. 26, 2012.

Steigerwald, et al., Illumination With SSL Technology, Mar. 2002.

STMicroelectonics, VIPower: Dimmable Driver for High Brightness LEDs With VIPER228-E, Mar. 2007.

Texas Instruments, LED Lighting Power Controller, Oct. 2008.

Xu, et al., High Dimming Ratio LED Driver With Fast Transit Boost Converter, Jun. 15, 2008.

* cited by examiner

INRUSH CURRENT LIMITED AC/DC POWER CONVERTER APPARATUS

CROSS-REFERENCE TO RELATED APPLICATIONS

This application is a continuation of International Patent Application #PCT/CA2019/051503 filed on Oct. 23, 2019, which claims priority from U.S. Provisional Patent Application No. 62/751,086 filed Oct. 26, 2018, the contents of which are both hereby incorporated by reference for any and all purposes.

TECHNICAL FIELD

The disclosure is directed generally at power conversion and, more specifically, at an inrush current limited AC/DC power converter apparatus and method.

BACKGROUND

Various approaches have been attempted to limit the inrush current during an initial power up of a power converter. Limiting inrush current is often necessary to reduce or prevent damage to equipment or the tripping of external circuit breakers and fuses.

One current approach to limiting inrush current is to include a Negative Temperature Coefficient (NTC) thermistor in series between the AC mains and the power converter storage capacitor. A NTC thermistor is a variable resistor that decreases in resistance as its temperature increases in response to current flow through the power converter apparatus. During initial power up of the power converter apparatus, when the thermistor is in a cold state, it will have maximum resistance and maximum current limiting capability. As the thermistor heats up, its resistance decreases and its power dissipation is also reduced.

One disadvantage of this thermistor implementation is that in its reduced resistance state (when the thermistor is hot), the thermistor can still dissipate a significant amount of power thereby reducing overall power conversion efficiency. This also results in a higher internal operating temperature for the power converter. Another disadvantage is that, during operation of the power converter apparatus, when the thermistor is hot and at a reduced resistance, a higher inrush current may result in an AC mains input brown out or a voltage dip and/or interruption.

Therefore, there is provided a novel inrush current limited AC/DC power converter apparatus.

SUMMARY

The disclosure is directed at an inrush current limited AC/DC power converter apparatus. In one embodiment, the apparatus includes a buck switch mode converter configured as a current source combined with a boost converter to limit inrush current during initial turn on or during brown out conditions.

The switching action of the buck converter limits current on a cycle-by-cycle basis. It also remains in a continuous on-state during normal operation with reduced power losses compared to a thermistor approach. Furthermore, the boost converter shares a zero crossing detection apparatus with the buck converter that reduces the component count and complexity of the power converter.

In one aspect, there is provided an inrush current limited AC/DC power converter apparatus including a switch mode buck power converter configured as a current source to limit inrush current to a storage capacitor; wherein the buck converter is coupled to a transition mode controlled PFC boost converter and wherein the buck converter and boost converter share a zero crossing detection circuit to control the switching action of said buck converter during initial start-up of AC/DC power converter and/or during voltage dips or interruptions of input AC mains.

In one aspect of the disclosure, there is provided an inrush current limited AC/DC power converter apparatus for controlling power to a load including a buck converter section; a power factor conversion (PFC) boost converter section; and a storage capacitor section; wherein in a first mode of operation, the boost converter section is disabled and the buck converter section is active and in a second mode of operation, the boost converter section is active and the buck converter section is disabled.

In another aspect, in the first mode of operation, the buck converter section charges the storage capacitor section; and in the second mode of operation, the PFC boost converter section controls power delivered to the load via the storage capacitor section. In a further aspect, the buck converter section includes a microcontroller unit; and a buck converter section current sense element. In yet a further aspect, the buck converter section includes a buck converter section power switch; and a gate driver. In another aspect, microcontroller unit includes a logic cell; and a timer. In yet another aspect, the apparatus includes a shared components section. In another aspect, the shared components section includes an inductor; and a zero current detection circuit.

In yet a further aspect, the boost converter section includes a transition mode (TM) boost controller and a power diode. In another aspect, the boost converter section further includes a boost converter section power switch; and a boost converter section current sense element circuit. In an aspect, the system includes a set of current senses for determining a current level within the inrush current limited AC/DC power converter apparatus.

In another aspect of the disclosure, there is provided a method of limiting inrush current including operating in a first mode of operation whereby a buck converter switching action controls an input current; determining if a peak current threshold has been met; operating in the first mode of operation if the peak current threshold has been met and operating in a second mode of operation whereby a booster converter switching action controls the input current if the peak current threshold is not met.

In yet another aspect, the method further includes charging a bulk capacitor. In another aspect, the method further includes regulating a power factor correction voltage. In yet a further aspect, the method includes determining if there is a voltage dip or interruption; and operating in the second mode of operation if there is no voltage dip or interruption and operating in the first mode of operation if there is a voltage dip or interruption.

BRIEF DESCRIPTION OF THE DRAWINGS

Embodiments of the present disclosure will now be described, by way of example only, with reference to the attached Figures.

DETAILED DESCRIPTION

The disclosure is directed at an inrush current limited AC/DC power converter apparatus. In one embodiment, the disclosure includes a buck converter section, a power factor correction (PFC) boost converter section and a bulk storage capacitor section. The disclosure is directed a method and apparatus for controlling, or limiting, the inrush current during predetermined situations, such as, but not limited to, initial turn on or brown out conditions.

Figure 1:
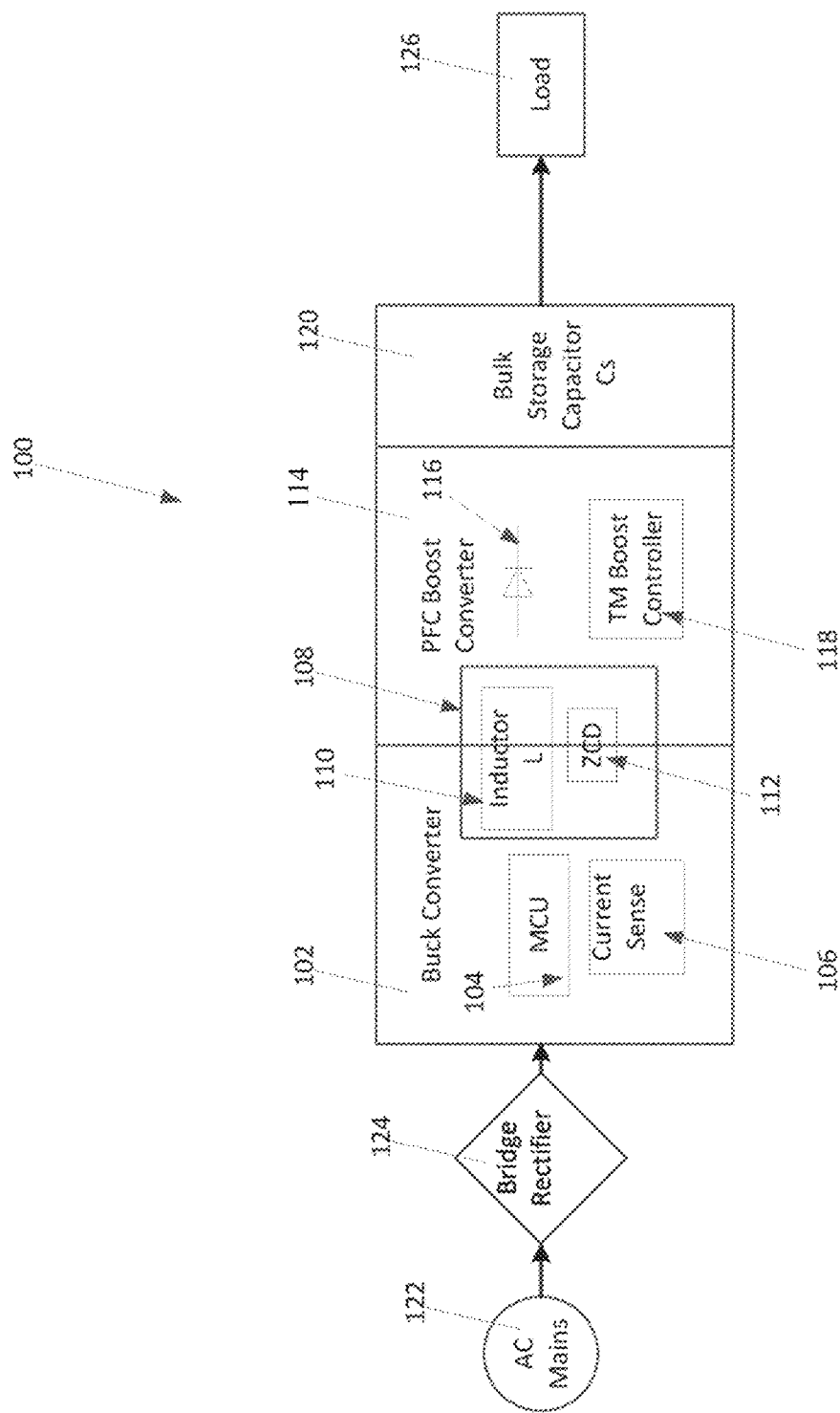
FIG. 1 is a schematic diagram of an inrush current limited AC/DC converter apparatus.

Turning to FIG. 1, a schematic diagram of an inrush current limited AC/DC power converter, or conversion, apparatus is shown. The inrush current limited AC/DC power conversion apparatus 100 includes a buck converter section 102 that includes a microcontroller unit (MCU) 104 and a current sense circuit or element 106. In operation, the MCU 104 controls a current feedback loop via the current sense element 106. In one embodiment, the buck converter section 102 may be configured as a current source.

The apparatus 100 further includes a shared components section 108 that includes a boost inductor 110 and a zero crossing detection (ZCD) circuit 112 and a boost converter section 114, or power factor correction (PFC) boost converter section, that includes a free wheel diode 116 and a Transition Mode (TM) or Critical Conduction Mode (CrM) controller 118. The buck converter section 102 can be seen as being coupled to the boost converter section 114 via the shared components section 108. The apparatus 100 further includes a bulk storage capacitor section 120. The apparatus 100 may include further components to enable operation of the apparatus that are not shown as they are not part of the innovation, however, are necessary for operation of the power conversion apparatus.

In operation of the apparatus 100, the buck and boost converter sections 102 and 114 share the boost inductor 110, the ZCD circuit 112, the storage capacitor 120 as well as the power diode 116. This is described in more detail below.

The power conversion apparatus 100 is coupled to an AC mains input 122, such as a sinusoidal voltage source, via a bridge rectifier 124. A load 126 is typically connected to the apparatus 100 and may include, but is not limited to, an isolated DC/DC converter coupled to either a resistive load or a light emitting diode (LED) load. In one embodiment, the DC/DC converter may be an isolated step down buck derived topology implemented as a half bridge, full bridge, or forward converter topology. Alternatively, the load 126 may be a resistive load or LED load.

Figure 2:
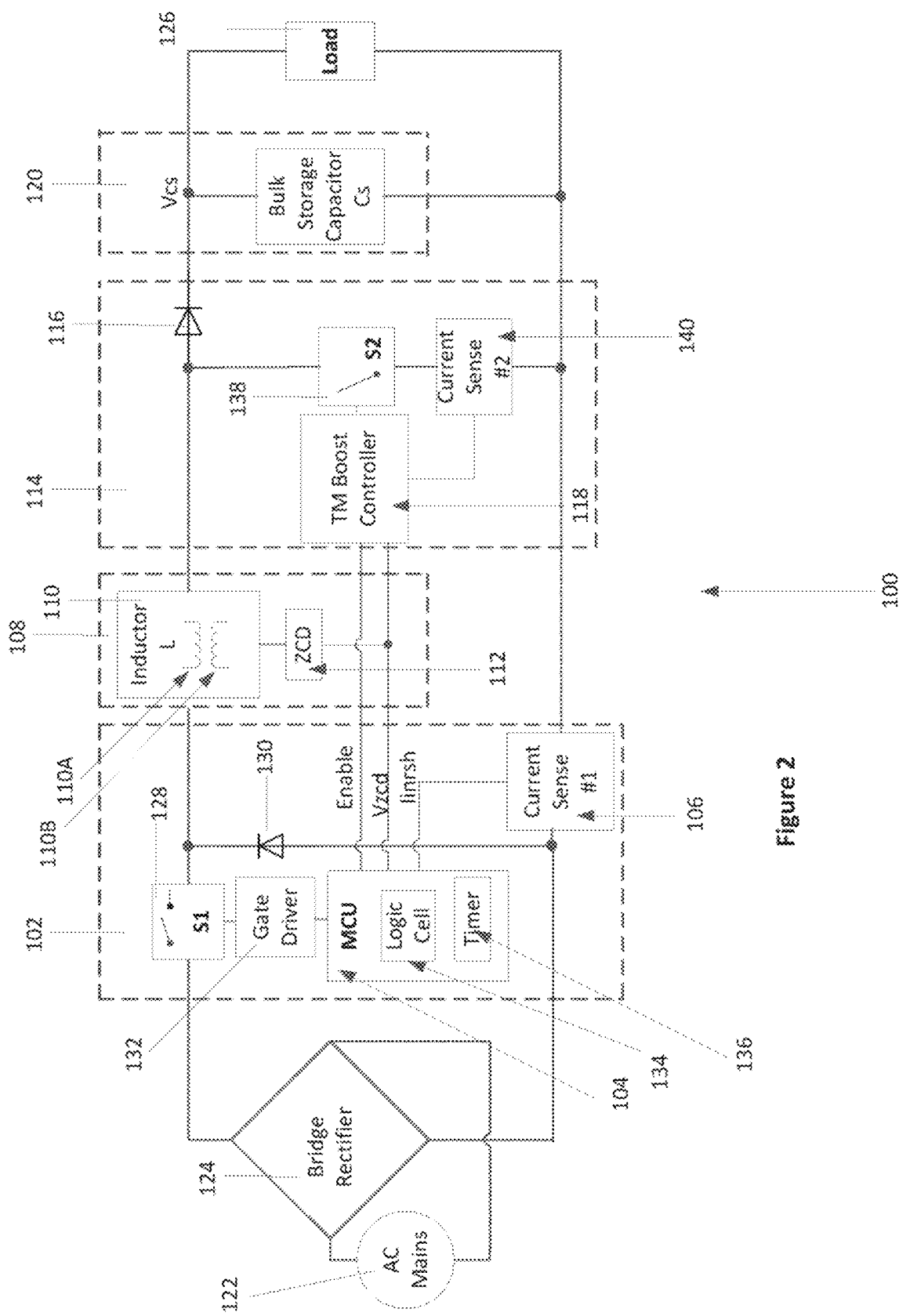
FIG. 2 is a schematic diagram of a combined buck and boost converter.

FIG. 2 provides a more detailed schematic diagram of the apparatus of FIG. 1. The power converter apparatus 100 may also be seen as a combined buck and boost switch mode converter. As shown in FIG. 2, the buck converter section 102 further includes a high side, or buck converter section, semiconductor power switch 128, such as a metal-oxide-semiconductor field-effect transistor (MOSFET) connected in series between the bridge rectifier 124 and the boost inductor 110. In a preferred embodiment, the boost inductor 110 includes two (2) windings. A first coil winding 110A is connected between a cathode of a buck converter section diode 130 and an anode of the power diode 116 to enable the transfer of energy from the inductor 110 to the bulk capacitor 120 during an appropriate switching sequence. A second coil winding 110B, referred to as an auxiliary winding, is coupled to the ZCD circuit 112 and in one embodiment, the second coil winding 110B is used for sensing purposes.

The buck converter section power switch 128 is also connected, via a gate drive circuit 132, to the MCU 104. In the current embodiment, the MCU 104 includes a configurable logic cell 134 and a timer 136. Although not shown, the logic cell 134 includes logic gates and state functions such as NAND/NOR gates, comparators and flip flops that can be configured within the MCU 104 to provide a gate drive signal to control the switching action of the buck converter section power switch 128 based on received input control signals to the MCU 104. Alternatively, the gate drive signal may be implemented via firmware.

The MCU 104 is connected to input control lines (such as $V_{ZCD}$ line) from the ZCD circuit 112 that includes a clamp circuit that senses a zero crossing voltage transition when the boost inductor 110 demagnetizes and the current sense circuit 106 senses current flow through the storage capacitor 120.

In one embodiment, the timer 136 includes a counter that counts, such as in 250 µs increments, for a predetermined duration of time during which the switching action of the buck converter section 102 via the buck converter section power switch 128 is permitted.

As shown in FIG. 2, the PFC boost converter section 114 further includes a boost converter section power semiconductor switch 138 such as a MOSFET connected between the boost inductor 110 and the anode side of power diode 116. A cathode side of the power diode 116 is connected to the bulk storage capacitor 120 and maintains a regulated DC voltage across the load 126.

As outlined above, not all components, circuit blocks and/or interconnections are shown as they will be understood by one skilled in the art. For example, the AC/DC power converter apparatus 100 may include an electromagnetic (EMI) filter connected between the AC mains input 122 and the bridge rectifier 124. Similarly, the PFC boost converter section 114 may include a voltage control loop circuit to regulate the voltage across the bulk storage capacitor 120.

For inrush current operation, and with reference to FIG. 2, the combined buck and boost converter apparatus 100 can operate in two modes of operation.

A first mode of operation occurs when an AC mains voltage input is initially applied and the combined buck and boost power converter apparatus 100 turns on. During the first mode of operation, a switching action of the buck converter section 102, limited to a peak current every switching cycle, charges the output capacitor 120. During the first mode of operation, the boost converter section 114 is disabled with its power switch 138 in its off state.

A second mode of operation begins after the initial turn on of the combined buck and boost apparatus 100 when the bulk, or output, capacitor 120 has charged such that an inrush current does not reach a predetermined threshold value or current within a predetermined period of time. At the start of the second mode of operation, the switching action of the buck converter section 102 is discontinued, or stopped while the power switch 128 remains in a continuous on state. The boost converter section 114 is then enabled and can begin switching. In this mode of operation, the boost converter section 114 continues to charge the bulk capacitor 120 to a regulated voltage Vcs and control peak input current while providing power factor correction.

In one embodiment, the predetermined threshold current may be calculated such that its value is greater than what can be reached during normal operation or the second mode of operation at 100% load and AC mains input 122 low line voltage input such as 100 Vac. For example, assuming a load 126 of 120 watts, a power conversion efficiency of 90% and a unity power factor, an input current of the combined buck and boost apparatus 100 can be calculated to be 1.33 Arms. With the boost converter section 114 operating in critical conduction mode during the second mode of operation, the expected peak current reached during normal operation is calculated to be 3.77 Apk. Therefore, in this instance, a predetermined threshold current of 3.9 Apk may be selected which is greater than the normal operating current of 3.77 Apk at a worst case line input voltage of 100 Vac.

With reference to the predetermined time period, as an example, the AC mains input 122 in North America is a 60 Hz sinusoidal voltage. The bridge rectifier 124 rectifies the sinewave resulting in a waveform with a period of 8.3 ms (milliseconds), therefore a predetermined period of time greater than 8.3 ms may be selected. For instance, a predetermined time period of 12 ms can be used such that at least one AC mains rectified sinewave cycle with a peak voltage transition Vbr may occur during this predetermined period of time.

A transition from the second mode of operation back to the first mode of operation occurs at any time when an AC mains input 122 power anomaly is experienced, such as a voltage dip or interruption, whereby the power anomaly results in the voltage across the bulk capacitor 120 decreasing significantly below a predetermined regulated output boost converter bus voltage.

During this transition, the buck converter section 102 detects, via current sense circuit 106, the input current to determine if a predetermined peak current threshold is reached as the bulk capacitor 120 is recharged. If the predetermined peak current threshold is reached, the buck converter section 102 changes from a continuous on-state to a switching action of power switch 128 and back to the first mode of operation whereby the inrush current is peak limited every switching cycle as the storage capacitor 120 recharges. In returning to the first mode of operation, the boost converter section 114 is disabled with no switching action and its power switch 138 is in the off-state.

In another example, during the first mode of operation at turn on, the buck converter section 102 begins to charge the bulk capacitor 120 via a switching action of power switch 128. When switch 128 is turned on (or closed), the inrush current and therefore the rate of change of current over time (di/dt) is limited by the inductor 110A as current ramps up and flows through power diode 116 to charge storage capacitor 120.

The inductor 110A limits or reduces the rate of increase of current with time based on the instantaneous rectified AC mains voltage Vbr at the bridge rectifier 124 and the storage capacitor DC voltage Vcs expressed as (ignoring diode drop losses):

$$di/dt = \frac{(Vbr - Vcs)}{L} \quad \text{(Eq. 1)}$$

where the differential voltage (Vbr–Vcs) is applied across inductor winding 110A.

When the switch 128 is turned off, the voltage across inductor 110A reverses polarity and the current continues to flow through power diode 116 and freewheel diode 130 into bulk capacitor 120, ramping downward over time as energy is transferred from the inductor 110A.

As the bulk capacitor 120 continues to charge with repetitive power switch 128 switching cycles, the differential voltage between the rectified sinewave mains peak point (Vbr) and the bulk capacitor Vcs declines such that eventually the ramp current (di/dt) does not reach its predetermined threshold within a predetermined period of time.

For example, in one specific embodiment, for an AC mains input 122 with a sinusoidal voltage of 120 Vac and a frequency of 60 Hz, the rectified peak voltage is established at 169.68 Vpk. The inductor value is 570 pH, the predetermined current threshold is 3.9 Apk, and the predetermined time period is set at 12 ms. Based on these parameters and with reference to Eq. 1, the bulk capacitor voltage Vcs is calculated to be 169.49 V.

Therefore, for a bulk capacitor voltage Vcs greater than 169.49 V, there will be no further switching action of switch 128 since the predetermined current threshold of 3.9 Apk is not reached within the predetermined time period of 12 ms.

The MCU 104 controls the switching action of buck converter section 102 by providing a gate drive signal (via gate driver circuit 132) to the power switch 128. The gate drive signal is generated and controlled by the configurable logic cell 134 based on input signal $V_{ZCD}$ from the ZCD circuit 112, the sense signal linrsh from current sense element 106 and timer 136. The configurable logic cell 134 is initialized during initial power up of the combined buck and boost converter apparatus 100. In a preferred embodiment, the initialization is implemented via firmware.

Both the timer 136 and the peak current sense signal determine when an inrush current sense event has concluded. In one specific embodiment, the MCU 104 is programmed to limit the sensed peak current to 3.9 amps peak for every switching cycle of power switch 128 to charge the bulk capacitor 120. The timer 136 is also established at a predetermined limit of 12 ms to detect a switching event.

If the peak inrush current of 3.9 A is reached (or sensed by the circuit 106), the gate drive circuit 132 turns the power switch 128 off and the timer is reset for another 12 ms interval via an interrupt and the power supply remains in or enters the first mode of operation. Once the 12 ms interval expires, the apparatus 100 enters the second mode of operation. After power switch 128 is turned off, the inductor 110A reverses voltage polarity and demagnetizes as the inductor current ramps to zero. The ZCD circuit 112 senses via inductor winding 110B (coupled to winding 110A), a zero crossing voltage $V_{ZCD}$ as the voltage transitions from positive to negative. At this point in time, the switch 128 is turned on to begin another switching cycle.

If the peak inrush current of 3.9 A is not reached within the 12 ms time frame, the inrush current limit event is determined to have concluded and the MCU 104 enables the TM boost controller 118 to begin switching the boost converter section 114 stage. The buck converter power switch 128 maintains an on-state condition unless a brown out event occurs. If a voltage dip or interruption occurs, the buck converter section 102 and corresponding power switch 128 may revert back to a switching action and the first mode of operation if the voltage across the bulk capacitor 120 decreases significantly below the peak rectified sinusoidal voltage.

As the timer 136 duration of 12 ms is approximately equal to one and a half cycles of a 120 Hz rectified sinusoidal AC mains voltage, it is understood that the timer duration can be configured for various other values and that the peak current threshold may also be configured for various values. The configuration requirements may be programmed into the MCU 104.

After the inrush current event has terminated, the second mode of operation begins and the boost converter section 114 is turned on with an enable control signal transmitted from the MCU 104 to the TM boost controller 118. It is understood that for those skilled in the art, the boost converter section 114 continues to control peak input current flow through the inductor 110A to charge the bulk capacitor 120 via current sense 140 and provide power factor correction and a regulated DC voltage across the bulk capacitor 120 typically around 450 Vdc.

In operation of the boost converter section 114, power factor correction is achieved by the input current being sourced in a sinusoidal manner to track with the input AC mains 122 sinusoidal voltage by a switching action of the boost converter. This results in a peak inductor current that is enveloped by a rectified sinusoidal waveform in phase with the input sinusoidal voltage.

The TM boost controller 118 controls the switching of power switch 138 in a fixed on-time, variable frequency mode of operation. In transition mode, the inductor 110 operates at the boundary between continuous and discontinuous conduction modes whereby the inductor current ramps to zero current every switching cycle.

The current flow through inductor 110A is sensed by a current sense 140 (located in the boost converter section 114) and the demagnetization of inductor 110A is sensed by inductor auxiliary winding 110B and ZCD circuit 112 to control the switching action of the power switch 138.

Figure 3A:
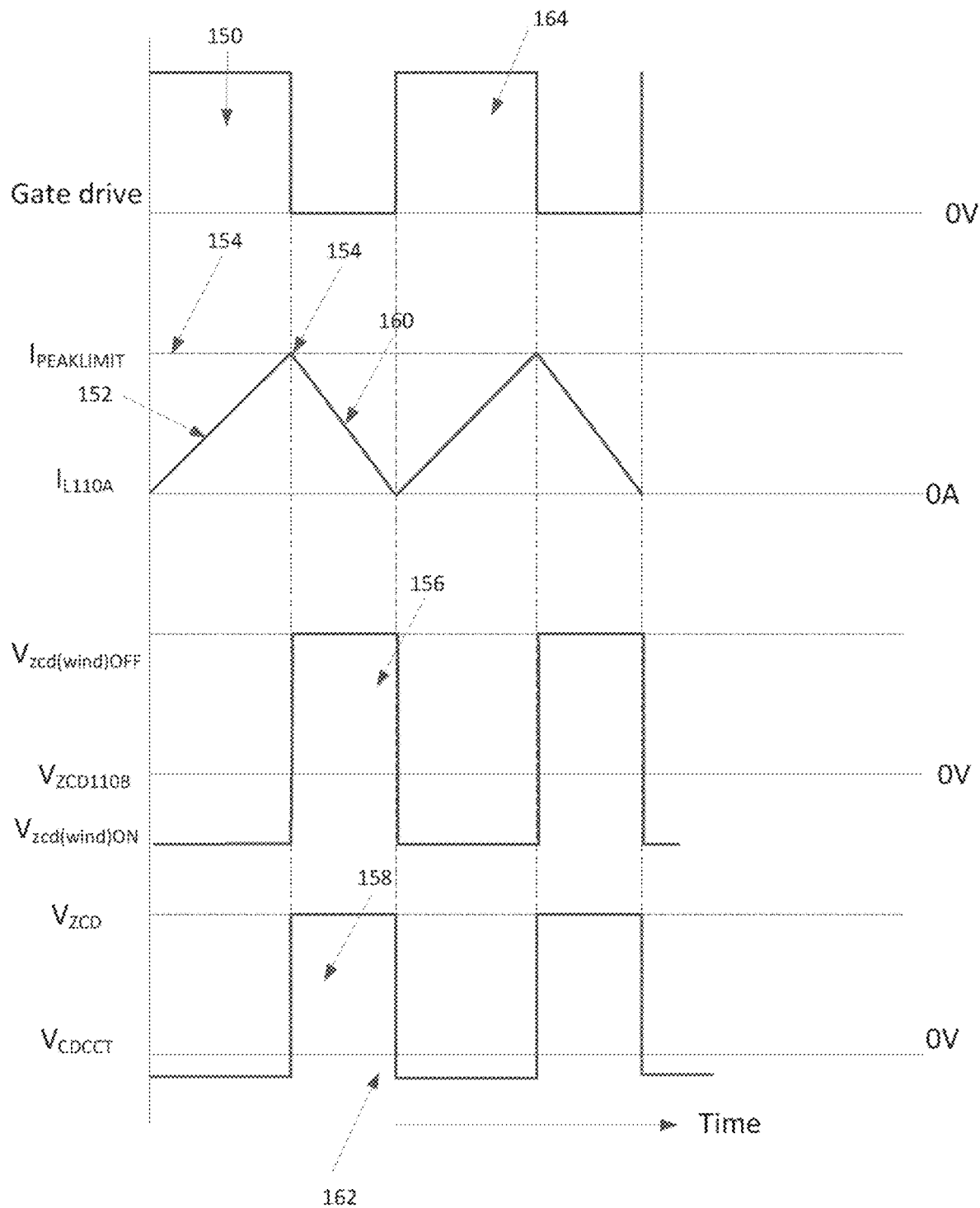
FIG. 3A is a schematic diagram of a set of buck converter control signal waveforms.

Turning to FIG. 3A, a set of signal waveforms for a buck converter to control inrush current are shown. The set of signal waveforms includes a gate drive signal waveform with an on and off duration, an Ulm signal waveform with an $I_{PEAKLIMIT}$, a $V_{ZCD110B}$ signal waveform with an off ($V_{ZCD\{wind\}OFF}$) threshold and an on ($V_{ZCD(wind)ON}$) threshold, and a $V_{CDCCT}$ signal waveform with a with a $V_{ZCD}$ drive threshold.

A gate drive turn on signal 150 is applied to the power switch 128 resulting in a current ramping 152 up through inductor 110 until a predetermined threshold is met 154.

When the predetermined threshold is met 154, the gate drive turns off the power switch 128, the auxiliary winding 110B reverses voltage polarity 156 as the inductor 110 demagnetizes, and a voltage pulse signal $V_{ZCD}$ drive is generated 158 by the ZCD circuit 112. At the threshold limit 154, the timer 136 is also reset for another 12 ms duration.

During the demagnetization of inductor 110, the current ramps to zero 160 and the $V_{ZCD}$ signal 158 transitions from positive to negative. At the transition of the $V_{ZCD}$ signal as the voltage crosses zero 162, the gate drive 164 turns on again beginning another current ramp cycle.

Figure 3B:
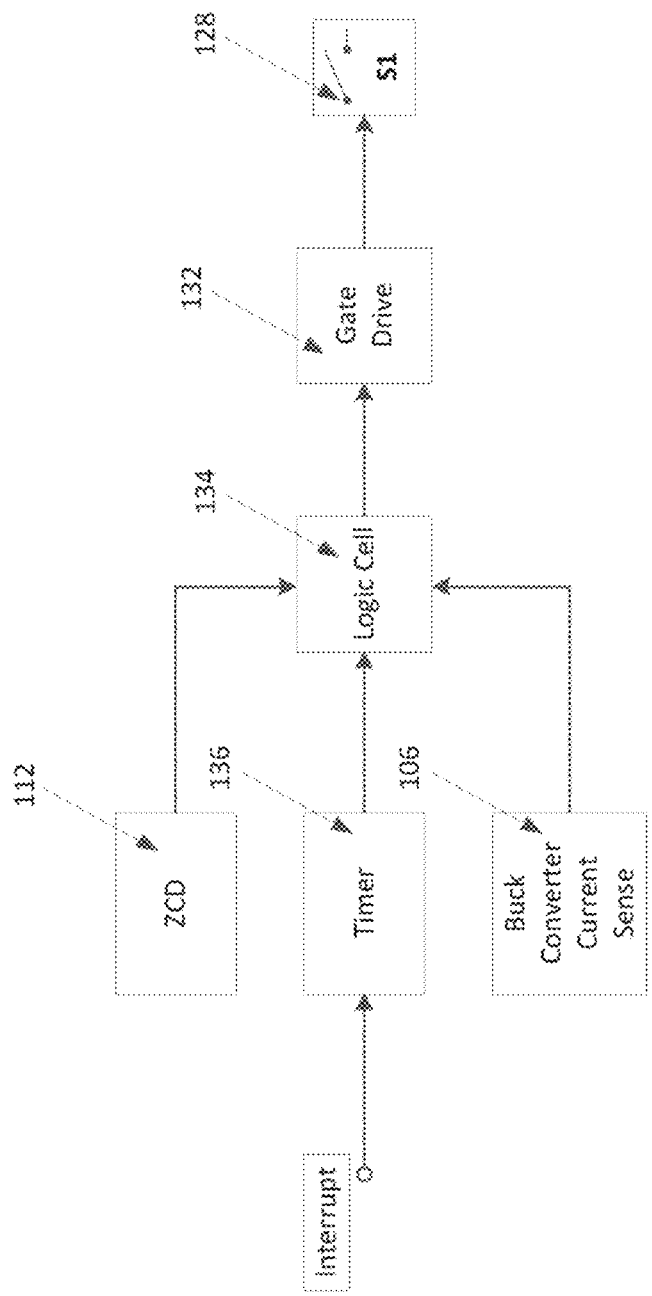
FIG. 3B is a schematic diagram of buck converter power switch control inputs.

FIG. 3B shows a detailed block diagram of a buck converter gate drive apparatus. During an inrush current limit mode of operation, the logic cell 134 controls the switching action of the power switch 128 based on inputs from the ZCD circuit 112, the current sense circuit 106 and timer 136.

The input that is sensed by the current sense circuit 106 assists to controls the turn off of the power switch 128 and the ZCD circuit 112 controls the turn on of the power switch. The timer 136 provides a time limit for the inrush current to ramp to its predetermined limit and an interrupt resets the time limit every time the peak current limit is reached.

The inrush current mode of operation concludes when the input current has not reached its predetermined limit within the time limit established by the timer 136.

Figure 4:
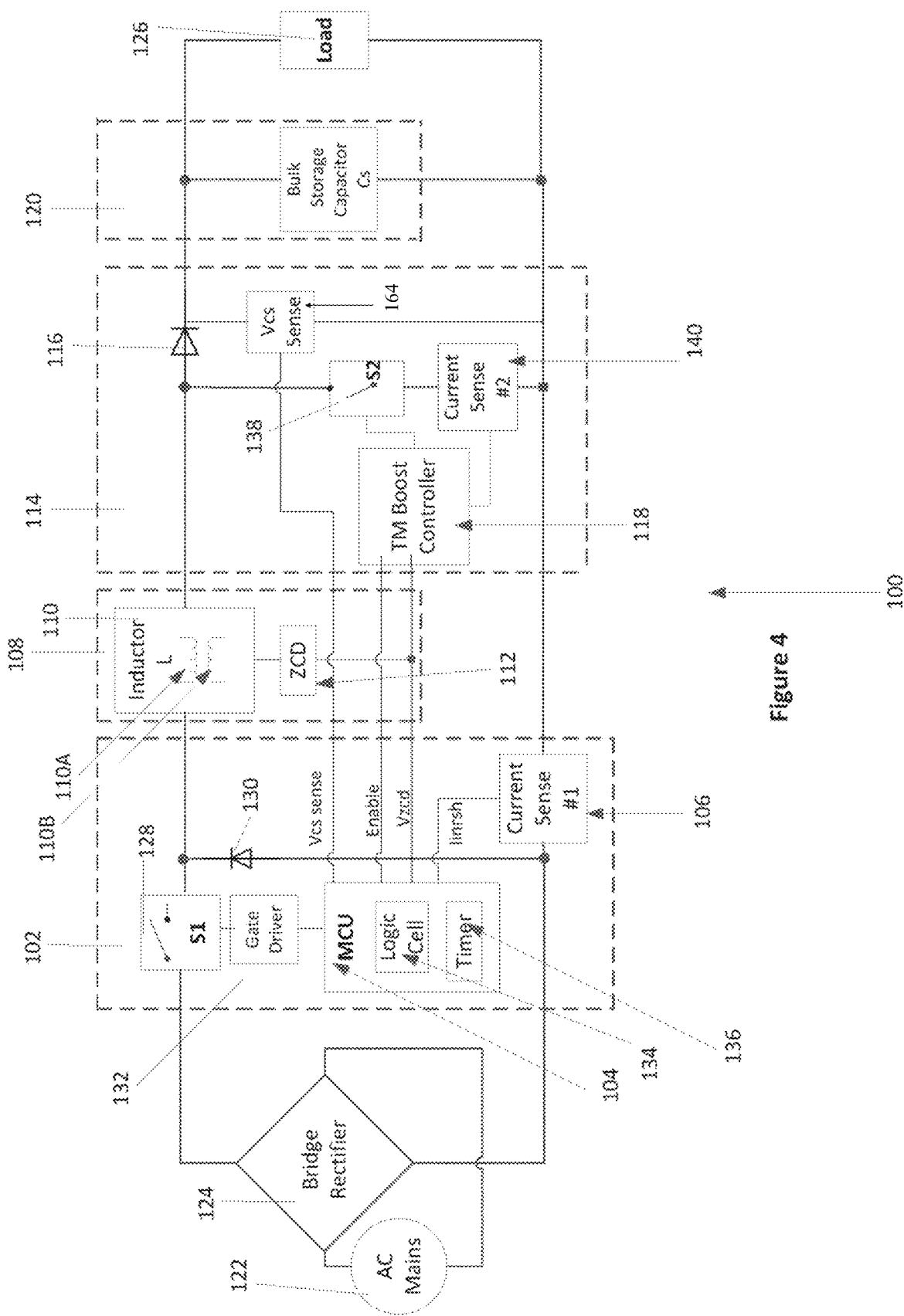
FIG. 4 is a schematic diagram of a combined buck and boost converter with under voltage lock out.

FIG. 4 shows an alternate embodiment of a combined buck and boost converter apparatus 100. In the current embodiment, the apparatus 100 includes a voltage sense circuit 164 that operates to monitor the storage capacitor voltage 120. The signal that is sensed by the voltage sense circuit 164 signal is transmitted to the MCU 104 and provides an additional control input signal as an under voltage lock out threshold to enable or disable the boost converter section 114.

For example, the MCU 104 can be programmed to reduce the likelihood or prevent the boost converter section 114 from activating or reduce the likelihood of the boost converter section 114 from activating until a predetermined capacitor voltage, such as a minimum or low capacitor voltage of 140 Vdc, is reached. When the threshold is reached, an enable signal is transmitted to the boost controller 118. All other aspects of operation of the combined buck and boost converter remain the same as the embodiment described above with respect to FIG. 2.

Figure 5:
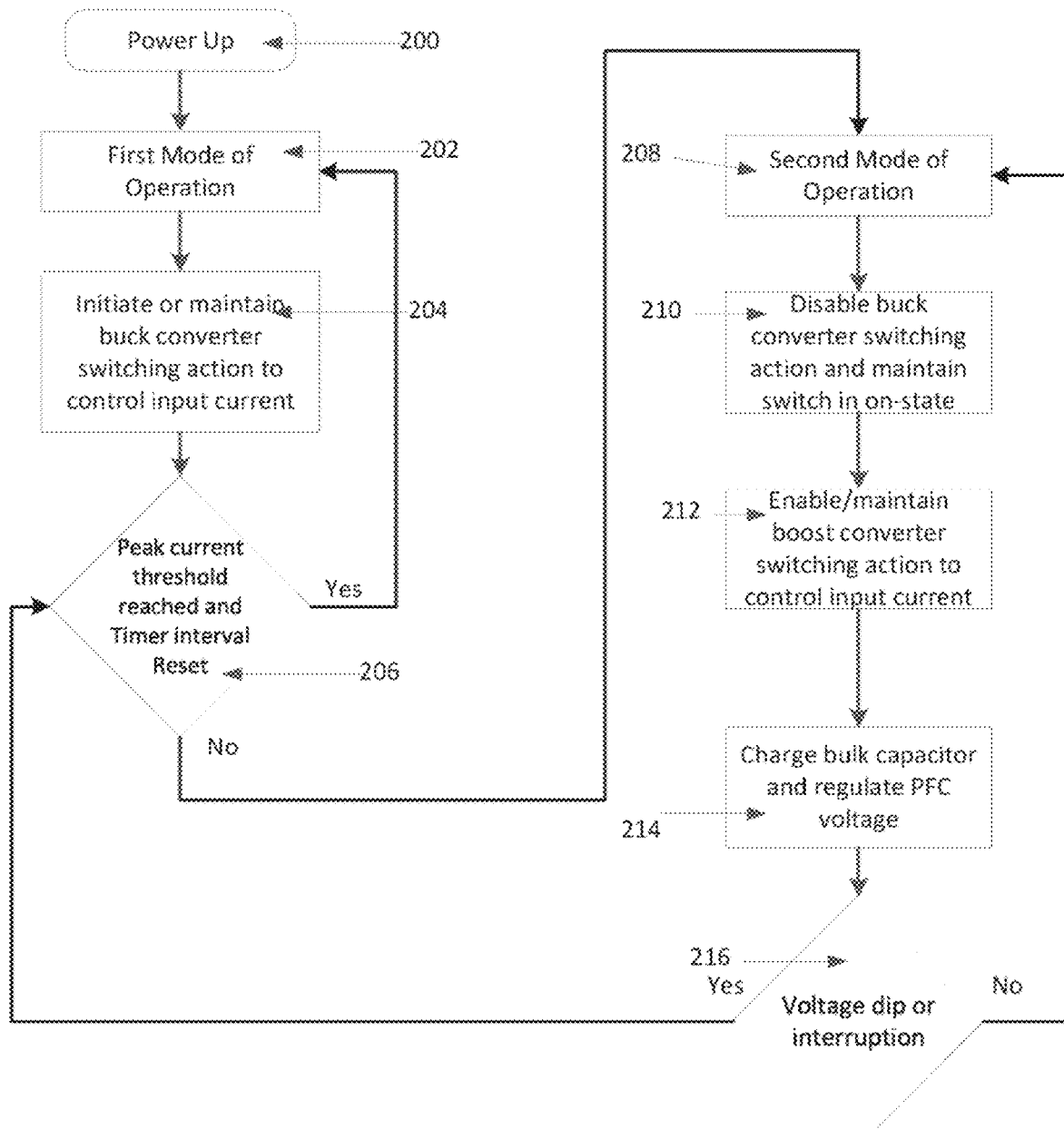
FIG. 5 is a flowchart outlining a method of limiting inrush current.

Turning to FIG. 5, a flowchart outlining a method of limiting inrush current is shown. Initially upon power up (200), the system or apparatus enters a first mode of operation (202). In this first mode of operation, buck converter switching action to control an input current is initiated or maintained (204).

A determination is then made to check if a peak current threshold has been reached, and if so, the timer interval is reset (206). If the peak current threshold has been reached, the system remains in the first mode of operation (202).

If the peak current threshold has not been reached within a time interval, the system enters a second mode of operation (208). In the second mode of operation, the buck converter switching action is disabled and the switch is maintained in an on-state (210). The booster converter switching action is then enabled or maintained to control the input current (212).

The bulk capacitor is then charged and the PFC voltage regulated (214). A check is then performed to determine if there is a voltage dip or interruption (216). If there is no voltage dip or interruption, the system remains in the second mode of operation (208). If there is a dip in voltage or an interruption, the system checks if a peak current threshold has been reached (206), and if so, the system or apparatus enters the first mode of operation (202).

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether elements of the embodiments described herein are implemented as a software routine, hardware circuit, firmware, or a combination thereof.

Embodiments of the disclosure or components thereof can be provided as or represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, s optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor or controller to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor, controller or other suitable processing device, and can interface with circuitry to perform the described tasks.

What is claimed is:

1. An inrush current limited AC/DC power converter apparatus for controlling power to a load comprising:
   a buck converter section including a buck converter switch;
   a boost converter section;
   a timer that is reset in response to reaching a predetermined peak inrush current threshold and expires a predetermined period of time after being reset; and
   a storage capacitor section;
   wherein in a first mode of operation, active upon startup until the timer expires, the boost converter section is disabled, the buck converter section is active, and the buck converter switch is turned off in response to reaching the predetermined peak inrush current threshold; and
   in a second mode of operation, which is activated in response to an expiration of the timer, the boost converter section is active and the buck converter section is disabled.

2. The apparatus of claim 1 wherein:
   in the first mode of operation, the buck converter section charges the storage capacitor section; and
   in the second mode of operation, the boost converter section controls power delivered to the load via the storage capacitor section.

3. The apparatus of claim 1 wherein the buck converter section comprises:
   a microcontroller unit; and
   a buck converter section current sense element;
   wherein the timer is included in the microcontroller unit.

4. The apparatus of claim 3, further comprising a shared components section that includes:
   an inductor coupled between the buck converter section and the boost converter section; and
   a zero current detection circuit.

5. The apparatus of claim 1 wherein the boost converter section comprises:
   a boost converter switch;
   a boost converter section current sense element circuit;
   a transition mode boost controller; and
   a power diode.

6. The apparatus of claim 4, wherein the microcontroller unit, while in the first mode of operation, is programmed to:
   (a) turn on the buck converter switch, and reset the timer;
   (b) detect that a current reported by the buck converter section current sense element has reached the predetermined peak inrush current threshold;
   (c) reset the timer and turn off the buck converter switch in response to the detection of the current reaching the predetermined peak inrush current threshold;
   (d) receive an indication from the zero current detection circuit that the current in the inductor has reached zero;
   (e) turn on the buck converter switch in response to receiving the indication that the current in the inductor has reached zero; and
   repeat (b)-(e) until the timer expires.

7. The apparatus of claim 6, wherein the predetermined peak inrush current threshold is based on an inrush current limit for the apparatus.

8. A method of limiting inrush current in a power converter having both a buck converter and a boost converter, the method comprising:
   operating the power converter in a first mode of operation upon startup until a timer expires, the first mode of operation including leaving a switch in the boost converter off and using a switch in the buck converter to control a current in an inductor in the power converter, at least in part, by turning off the buck converter switch in response to reaching a predetermined peak inrush current threshold; and
   operating the power converter in a second mode of operation upon expiration of the timer, the second mode of operation including leaving the switch in the buck converter on and using the switch in the boost converter to control the current in the inductor in the power converter;
   wherein the timer is reset in response to reaching the predetermined peak inrush current threshold and expires a predetermined period of time after being reset.

9. The method of claim 8, wherein, the first mode of operation includes:
   (a) turning on the switch in the buck converter, and resetting the timer;
   (b) detecting that the current in the inductor has reached the predetermined peak inrush current threshold;
   (c) turning off the switch in the buck converter in response to the detection of the current in the inductor reaching the predetermined peak inrush current threshold;
   (d) detecting that the current in the inductor has reached zero;
   (e) turning on the switch in the buck converter in response to the detection of the current in the inductor reaching zero; and
   repeating (b)-(e) until the timer expires.

10. The method of claim 8, wherein the predetermined peak inrush current threshold is based on an inrush current limit for the power converter.

11. The method of claim 8, wherein the inductor is shared between the buck converter and the boost converter.

12. The method of claim 8, further comprising:
   charging a bulk capacitor in the power converter during the first mode of operation; and
   regulating a voltage across the bulk capacitor using the switch in the boost converter during the second mode of operation.

13. The method of claim 12, further comprising:
   detecting, while operating the power converter in the second mode of operation, a voltage dip or interruption in the voltage across the bulk capacitor; and
   reverting to operating the power converter in the first mode of operation in response to the detection of the voltage dip or interruption.

14. The method of claim 8, further comprising:
using a fixed on-time, variable frequency mode of operation for the switch in the boost converter to control the current in the inductor while operating the power converter in the second mode of operation.

15. The method of claim 8, further comprising:
using the switch in the boost converter to source the current in the inductor to be in phase with a peak voltage of an input AC voltage to the power converter.

16. The method of claim 8, further comprising:
charging a bulk capacitor in the power converter during the first mode of operation; and
regulating power delivered to a load during the second mode of operation, wherein the load is coupled to the power converter in parallel with the bulk capacitor.

17. An inrush current limited AC-to-DC power converter comprising:
a buck converter section including a buck converter switch;
a boost converter section including a boost converter switch;
an inductor coupled between the buck converter section and the boost converter section;
a storage capacitor section coupled to an output of the boost converter section; and
control circuitry, coupled to the buck converter switch and the boost converter switch, comprising a timer that is reset in response to reaching a predetermined peak inrush current threshold and expires a predetermined period of time after being reset;
the control circuitry configured to:
operate in a first mode of operation during an inrush current event; and
operate in a second mode of operation after the inrush current event has terminated, the second mode of operation including leaving the buck converter switch on and using the boost converter switch to control a current in the inductor;
the first mode of operation including:
(a) turning off the boost converter switch, and turning on the buck converter switch;
(b) detecting that the current in the inductor has reached the predetermined peak inrush current threshold;
(c) turning off the buck converter switch in response to the detection of the current in the inductor reaching the predetermined peak inrush current threshold;
(d) detecting that the current in the inductor has reached zero;
(e) turning on the buck converter switch in response to the detection of the current in the inductor reaching zero; and
repeating (b)-(e) until the timer expires, terminating the inrush current event.

18. The power converter of claim 17, wherein the predetermined peak inrush current threshold is based on an inrush current limit for the power converter.

19. The power converter of claim 17, the control circuitry further comprising:
a microcontroller unit configured to control the buck converter switch;
a gate driver for the buck converter switch coupled between the microcontroller unit and the buck converter switch; and
a buck converter section current sense element, coupled to the microcontroller unit, to sense the current in the inductor.

20. The power converter of claim 19, the control circuitry further comprising:
a boost converter section current sense element to sense a current through the boost converter switch; and
a controller coupled to the boost converter section current sense element, the microcontroller unit, and the boost converter switch, and configured to control the boost converter switch;
wherein the microcontroller unit is further configured to enable the controller while in the second mode of operation.

21. The power converter of claim 19, the microcontroller unit comprising the timer.

22. The power converter of claim 17, further comprising a voltage sensor, coupled to the control circuitry, to sense a voltage across the storage capacitor section;
wherein the storage capacitor section is charged during the first mode of operation; and
the voltage across the storage capacitor section is regulated using the boost converter switch during the second mode of operation.

23. The power converter of claim 22, the second mode of operation further including:
detecting a voltage dip or interruption in the voltage across the storage capacitor section; and
reverting to the first mode of operation in response to the detection of the voltage dip or interruption.

24. The power converter of claim 17, the second mode of operation further including:
using a fixed on-time, variable frequency mode of operation for the boost converter switch to control the current in the inductor.

25. The power converter of claim 17, the second mode of operation further including:
using the boost converter switch to source the current in the inductor to be in phase with a peak voltage of an input AC voltage to the power converter.

26. The power converter of claim 17, wherein the storage capacitor section is charged during the first mode of operation; and
power delivered to a load that is coupled to the power converter in parallel with the storage capacitor section is regulated during the second mode of operation.

27. The power converter of claim 17, further comprising:
an auxiliary winding of the inductor; and
circuitry, coupled to the auxiliary winding and the control circuitry, to detect a change of polarity of a voltage across the auxiliary winding that indicates a zero-crossing of the current in the inductor.

* * * * *